(12) United States Patent
Athavale et al.

(10) Patent No.: US 6,348,374 B1
(45) Date of Patent: Feb. 19, 2002

(54) PROCESS FOR 4F2 STC CELL HAVING VERTICAL MOSFET AND BURIED-BITLINE CONDUCTOR STRUCTURE

(75) Inventors: Satish D. Athavale, Fishkill; Gary B. Bronner, Stormville; Ramachandra Divakaruni, Somers, all of NY (US); Ulrike Gruening, Munich (DE); Jack A. Mandelman, Stormville; Carl J. Radens, LaGrangeville, both of NY (US)

(73) Assignee: International Business Machines, Armonk, NY (US)

( * ) Notice: Subject to any disclaimer, the term of this patent is extended or adjusted under 35 U.S.C. 154(b) by 0 days.

(21) Appl. No.: 09/597,887

(22) Filed: Jun. 19, 2000

(51) Int. Cl.[7] .......................................... H01L 21/8242
(52) U.S. Cl. ....................... 438/243; 438/242; 438/262; 438/427
(58) Field of Search .................................. 438/243, 244, 438/250, 253, 254, 257, 258, 259, 262, 242, 427; 257/301, 302, 906, 908

(56) References Cited

U.S. PATENT DOCUMENTS 6,013,548 A * 1/2000 Burns, Jr. et al. ........... 438/242

* cited by examiner

Primary Examiner—Charles Bowers
Assistant Examiner—Yennhu B. Huynh
(74) Attorney, Agent, or Firm—Connolly Bove Lodge & Hutz, LLP; Steven Capella, Esq.

(57) ABSTRACT

A method of forming a vertical transistor. A pad layer is formed over a semiconductor substrate. A trough is formed through the pad layer and in the semiconductor substrate. A bit line is formed buried in the trough. The bit line is enclosed by a dielectric material. A strap is formed extending through the dielectric material to connect the bit line to the semiconductor substrate. The trough is filled above the bit line with a conductor. The conductor is cut along its longitudinal axis such that the conductor remains on one side of the trough. Wordline troughs are formed, substantially orthogonal to the bit line, above the semiconductor substrate. A portion of the conductor is removed under the wordline trough to separate the conductor into separate gate conductors. Wordlines are formed in the wordline trough connected to the separate gate conductors.

11 Claims, 20 Drawing Sheets

PROCESS FOR 4F2 STC CELL HAVING VERTICAL MOSFET AND BURIED-BITLINE CONDUCTOR STRUCTURE

BACKGROUND OF THE INVENTION

1. Field of the Invention

The present invention relates to semiconductor fabrication and more particularly, to a structure and method for forming a vertical MOSFET over a buried bit line conductor with stacked capacitors formed above the surface of the silicon.

2. Background of the Invention

Present trends in DRAM technology are constantly driving towards reduction in minimum feature size and more compact cell layouts. As a result of the need for ever increasing array densities, the scalability of contemporary planar MOSFET cells using trench storage capacitors for feature sizes equal to 150 nm and smaller is facing fundamental concerns. The main concern with the scalability of the cell MOSFET is the increased p-well doping concentration needed to meet off-current objectives. It is known in the art that increased array well doping concentration may result in a marked increase in array junction leakage, which degrades retention time. The problems of scalability related to the cell MOSFET, by itself, is driving the paradigm shift towards vertical MOSFET access transistors in the array.

As far as storage capacitors are concerned, as ground rules are reduced the amount of capacitance available from deep trench storage capacitors decreases. This is a result of limitations on the scalability of the thickness of the node dielectric, limitations on the etch depth of the deep trench, and because of the reduction of capacitance area that occurs with ground rule reduction (scaling) and more dense cell layouts. RIE lag effect caused by the smaller storage trench openings makes etching adequately deep trenches difficult. Filling of this extremely high aspect ratio, for example, aspect ratios greater than 50:1, presents major difficulties. Furthermore the higher aspect ratios associated with aggressively scaled deep trench capacitors results in increased series resistance, which, in turn, results in greatly decreased signal development within a given time window. Barring any significant developments regarding higher dielectric constant node insulators and trench fill materials having lower resistivity, it is predicted that trench capacitor storage elements may not be practical beyond the 120 nm generation. Therefore, the long-term (100 nm and beyond) prognosis for the favored DRAM storage element appears to be stacked capacitors (STC). Still, significant improvements concerning the leakage and reliability of high dielectric materials (i.e. BTSO) for STC cells must occur before widespread manufacturing is likely. However, because of the popularity of STC DRAM, extensive industry wide resources are being directed to solve the problems associated with BSTO and other high dielectric materials.

Integration of vertical access MOSFETs and stacked capacitors is a challenging task and has not yet been adopted by the industry. As commonly practiced by DRAM manufacturers, word lines, bit lines and stacked capacitors all reside on or above the silicon surface. Such an arrangement of these cell elements with a vertical access transistor would apparently complicate forming the connections with the access transistor and would also apparently occupy more silicon real estate than deep trench capacitor DRAM cells with vertical access MOSFETS. Only a limited amount of art exists for STC cells with access transistors having some portion of the channel oriented vertically. The use of vertically oriented channels seeks to decouple the channel length of the cell access MOSFET from the minimum lithographic feature size.

Although some existing DRAM cells employing vertical MOSFETs offer very significant scalability advantages over conventional planar design practiced today, there is still a great deal of room for improvement. For example, for cells using vertical MOSFETs and trench storage capacitors, a single bit line contact is commonly used to access a pair of bits; the pair of bits share a common silicon active area. In this type of cell dynamic coupling between the two back to back vertical MOSFETs results in charge pumping effects and loss of signal. Modeling has shown that electrons pumped into the P-well from a collapsing channel inversion layer of one cell may be collected by the storage node of the adjacent cell sharing the same active area. These coupling effects are accentuated as dimensions are scaled down. Modeling projections indicate that scalability to 100 nm and below may be problematic because of dynamic charge loss due to coupling between adjacent cells.

Thus, there is a need for a DRAM cell containing vertical access transistors and stacked capacitor storage elements. It is desired that the dynamic coupling effect between adjacent vertical MOSFETs be reduced or eliminated to extend scalability below 100 nm feature size.

SUMMARY OF THE INVENTION

The present invention provides a method of forming a vertical transistor. A pad layer is formed over a semiconductor substrate. A trough is formed through the pad layer and in the semiconductor substrate. A bit line is formed buried in the trough. The bit line is enclosed by a dielectric material. A strap is formed extending through the dielectric material to connect the bit line to the semiconductor substrate. The trough is filled above the bit line with a conductor. The conductor is cut along its longitudinal axis such that the conductor remains on one side of the trough. Wordline troughs are formed, substantially orthogonal to the bit line, above the semiconductor substrate. A portion of the conductor is removed under the wordline trough to separate the conductor into separate gate conductors. Wordlines are formed in the wordline trough connected to the separate gate conductors.

Additionally, the present invention provides a method of forming a semiconductor device. A pad layer is formed over a semiconductor substrate. A hard mask is formed on the pad layer. A nitride layer is formed on the hard mask. A trough is formed into the semiconductor substrate. A bit line is formed buried in the trough. The bit line is enclosed by a dielectric material. A strap is formed extending through the dielectric material to connect the bit line to the semiconductor substrate. The trough is filled with doped glass. The glass is recessed below the nitride layer. A polysilicon layer is formed over the device. The polysilicon has an undoped portion above part of the glass in the trough. The undoped portion of the polysilicon is removed. A portion of the glass is removed using the polysilicon as a mask to form an opening in the trough. The opening is filled with an insulating material. The remaining portion of the glass is removed from the trough. A gate conductor is formed in the area vacated by the glass.

Furthermore, the present invention provides a method of forming a semiconductor device. A buried bit line and a conductive strap are formed in a trough in a semiconductor substrate. A gate conductor is formed in the trough above the buried bit line. Wordline troughs are formed substantially orthogonal to the bit line. The wordline troughs are filled with glass. The glass is removed above a portion of the gate conductor. The gate conductor is etched using the glass as a mask to form an opening. The opening is filled with an insulator. The remaining portions of the glass are removed. A wordline is formed contacting the gate conductor in the wordline trough.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

The present invention provides a $4F^2$ DRAM cell using vertical MOSFETS, buried bit lines and stacked capacitors, along with a fabrication process. The structure utilizes a single bit per bit line contact, while at the same time defers the onset of partial floating body effects due to the isolation of the active silicon region from the source of voltage bias that is seen with other single bit per active area designs in the art.

In the course of describing the structure and process of the DRAM cell, other novel structural and process features are disclosed. For example, the process results in an active silicon region containing a MOSFET whose size is independent of all overlay variations. Particularly, at very small feature sizes, it is important to avoid dimensional variations in the active silicon region. Sensitivity of the size of the active area to process variations results in large variations in the electrical characteristics of the MOSFET, for example, Vt back biased sensitivity, and sub-Vt swing, which is very undesirable for DRAM. Additionally, the process employs a novel "resist CMP" method for defining certain submininum lithographic features. Furthermore, the present invention teaches a structure and a process for forming an electrical connection between a master wordline and a gate conductor of the cell MOSFET. Still another feature of the present invention is a maskless process for forming capacitor contact regions.

Figure 1:
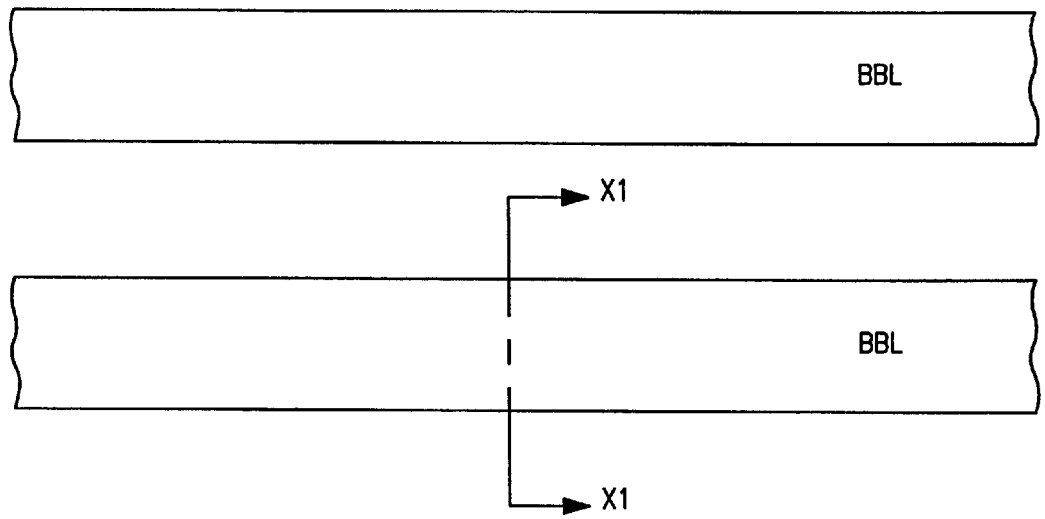
FIG. 1 is a top view of a semiconductor substrate.
Figure 2:
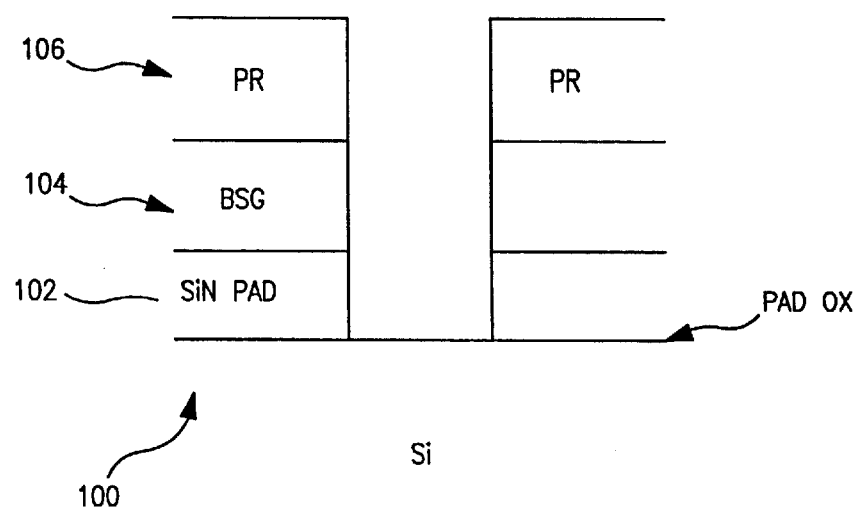
FIG. 2 is a cross-section taken along line X1—X1 of FIG. 1 showing a pad structure.

Turning now to FIGS. 1 and 2, a customary silicon substrate 100 with standard pad layers is shown as a starting point for an embodiment of a process according to the invention. Substrate 100 may be a p-silicon substrate with a pad oxide 101 and a nitride pad 102 deposited thereon. A dielectric layer, such as BSG layer 104, is formed on top of nitride pad 102. A buried bit line mask is used to define stripes in a photoresist layer 106. The exposed underlying dielectric layers 104, 102, 101 are then etched to a surface of substrate 100. Photoresist 106 is removed and BSG 104 serves as an etch mask during etching of bit line troughs into the silicon substrate 100.

Figure 3:
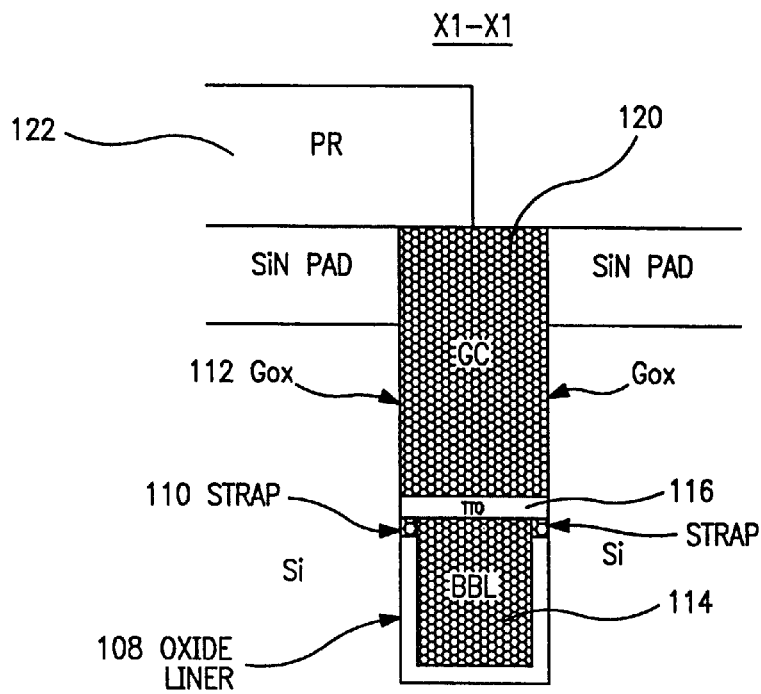
FIG. 3 is a cross-section view showing a buried bit line trough.

After etching the bit line troughs, oxide liner 108, bit line 114, straps 110, trench top oxide 116, gate oxide 112 and gate conductor 120 are then formed in the troughs and are shown in FIG. 3. The process for forming these features is described in U.S. application Ser. No. 09/602,476 the entire contents of the disclosure of which is hereby incorporated by reference. Additionally, other features, such as a doped region to form a strap diffusion which is self-aligned to the gate connector edge, may be included but are not shown here for simplicity. After planarization of the gate conductor 120 to the top surface of the nitride pad 102, another layer of photoresist 122 is deposited exposed and developed. As shown in FIG. 3, photoresist 122 covers approximately ½ of a width of the gate conductor 120. Etching is then performed to remove the exposed half of gate conductor 120, and strap 110 from one side of the trench sidewall.

Figure 4:
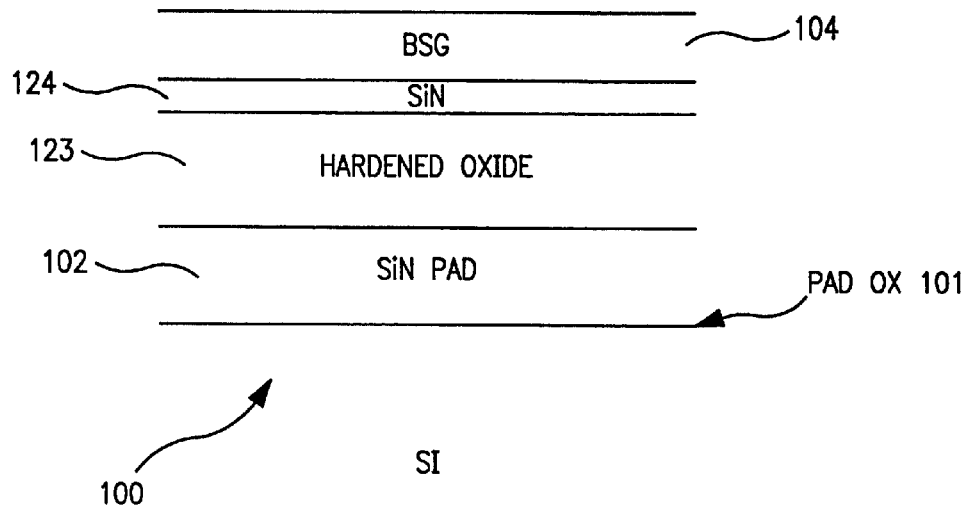
FIG. 4 is a cross-section showing an alternative pad structure.
Figure 5:
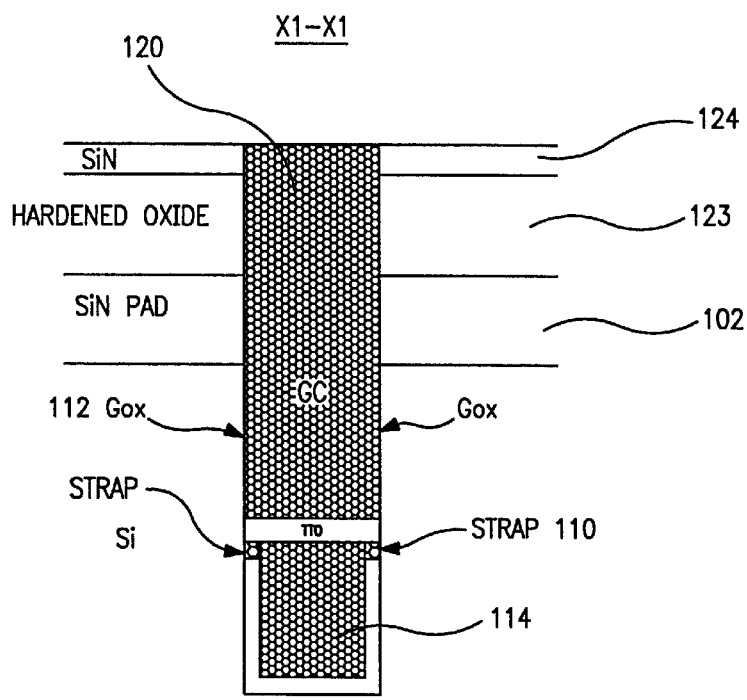
FIG. 5 is a cross-section view showing a buried bit line trough.
Figure 6:
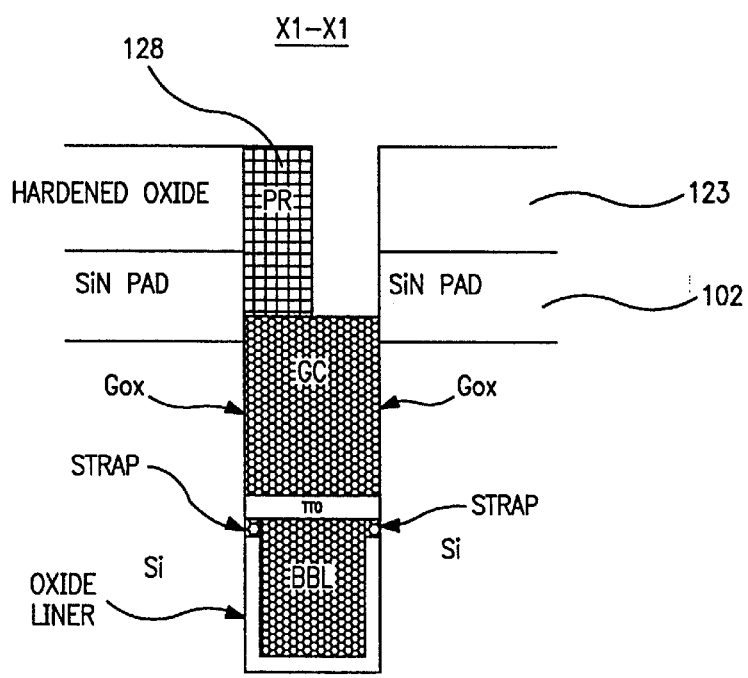
FIG. 6 is view FIG. 5 where the gate conductor is recessed.

FIGS. 4–6 illustrate an alternative embodiment for cutting the gate conductor 120 and strap 110. In the alternative embodiment, dielectric layers, which may include a hardened oxide mask 123 and nitride layer 124, are formed on the silicon substrate 100 in addition to the layers 101, 102, 104 shown in FIG. 2. BSG 104 again serves as an etch mask during etching of the buried bit line trough into silicon substrate 100. Nitride layer 124, which is about 20 nanometers thick, serves as a planarization stop for gate conductor 120. Hardened oxide 122, for example, densified TEOS, serves as a etch mask during cutting of the gate conductor 120 and strap 110. The hardened oxide 123 is preferably about 250 nanometers thick. Nitride pad 102 is about 150 nanometers thick and may be formed on an underlying pad oxide 101, which is preferably 5–10 nanometers of thermally grown oxide.

The dielectric stack including layers 101, 102, 104, and 124 is patterned with the buried bit line photoresist mask and etched to the surface of the silicon substrate 100, preferably using an RIE process. The exposed silicon 100 is then etched to a depth, typically about 1–3 microns, below the surface of substrate 100. The formation of layers in the buried bit line trough is then performed as described above in conjunction with FIG. 3. In the alternative embodiment, the gate conductor 120 is planarized to the top surface of nitride layer 124, resulting in the structure shown in FIG. 5. Nitride layer 124 is then stripped, preferably using known wet etching methods, and the gate conductor 120 is recessed, for example using RIE, to a depth which is preferably slightly above the top surface of the silicon substrate 100, as shown in FIG. 6. A layer of photoresist 128 is deposited and planarized. Preferably, the resist is planarized by a CMP process to the top surface of nitride pad 102. Optimally, an HF etch is performed to clean up the nitride pad 102 and remove any residual slurry from the planarization process. The thickness of photoresist 128 is controlled by how deep the gate conductor 120 is recessed below the top surface of hardened oxide 122. Thus, the thickness of hardened oxide 123 is selected to provide the desired thickness for the photoresist 128 after CMP processing. For shallow recess depths, typically between 300–500 nanometers, photoresist 128 is thinner than conventionally applied resists. The thin photoresist 128 results in improved lithographic resolution, which facilitates the printing of the cut mask image. The resist pattern is then exposed and developed as shown in FIG. 6. Note that the nominal position of the edge of the photoresist 128 is approximately mid-way across the width of the buried bit line trough.

Figure 7:
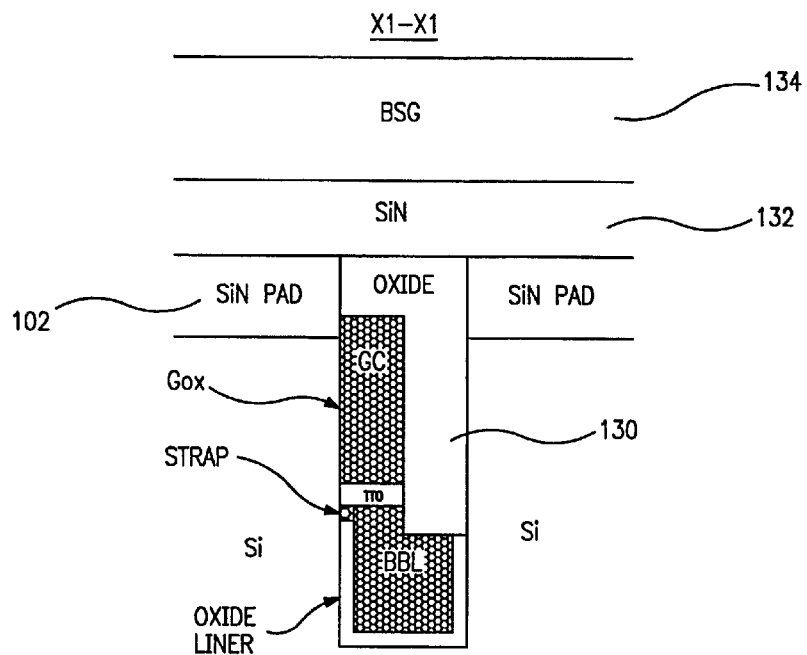
FIG. 7 is a view of FIG. 6 where the gate conductor is cut.

From this point, the different embodiments of forming the gate conductor/strap cut mask come together. The surface not protected by the photoresist 122 or 128, shown in FIGS. 3 and 6, respectively, or the various oxide layers, is etched through the gate conductor 120, through the trench top oxide 116 and into the bit line conductor 114. As shown in FIG. 7, the gate conductor 120 is cut such that the trench sidewall now has gate conductor 120 remaining on only on a single side. Additionally, the cutting process removes the buried bit line strap 110 from one side of the trough. Following the etching process, the photoresist 122 or 128 is stripped and the remaining groove is filled with a CVD oxide 130 or other suitable insulator. A polishing step is then performed to planarize oxide 130 to the top surface of nitride pad 102. Any other remaining layers, such as hardened mask 122, are also removed at this time. An additional nitride layer 132 and another hard mask, such as BSG 134, are then formed over the device surface.

Figure 8:
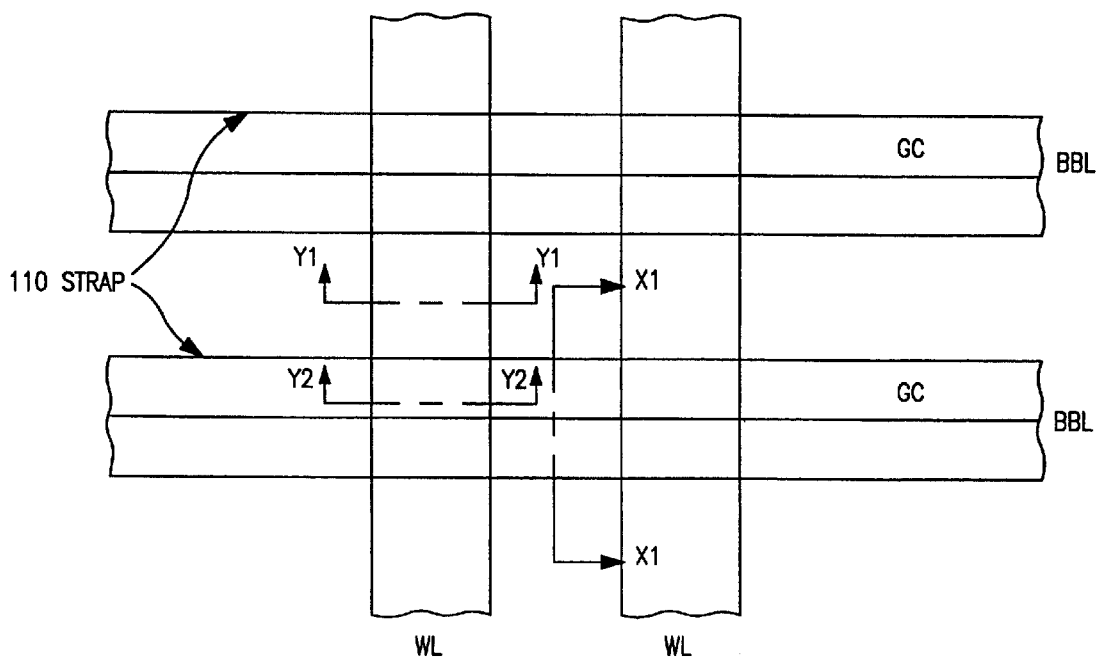
FIG. 8 is a top view of FIG. 7.
Figure 9:
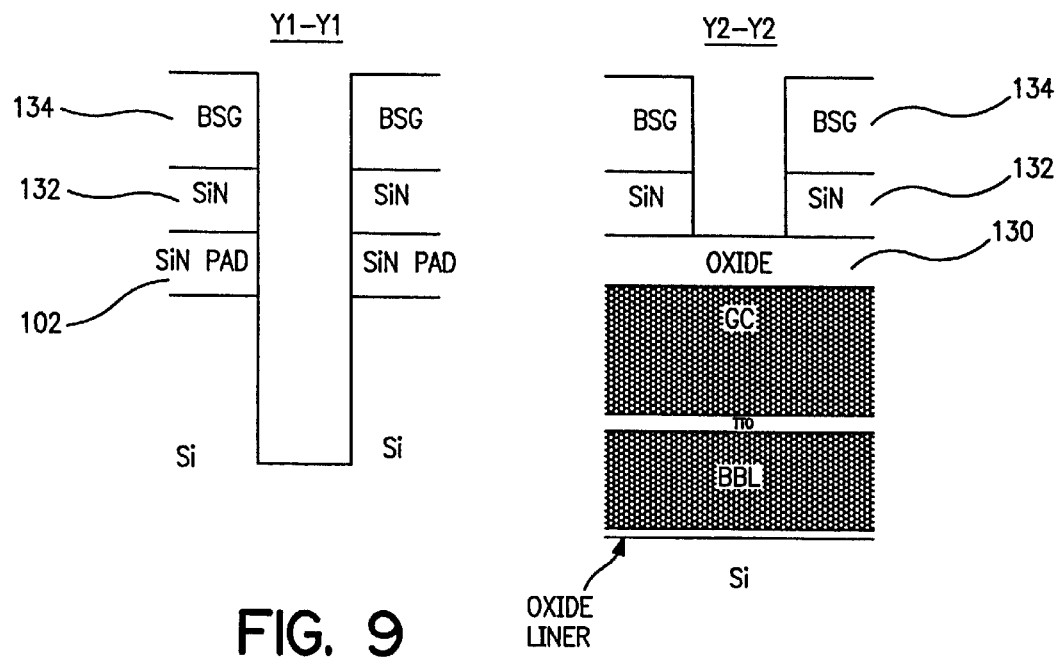
FIG. 9 is a cross-section view taken along lines Y1—Y1 and Y2—Y2 of FIG. 8.

Next, wordlines are formed. FIG. 8 shows a top view of the device illustrating the placement of the wordlines. Two new cross sections Y–Y1 and Y–Y2 are shown in FIG. 8 and will be referred to in the following discussion. Note that in FIG. 8 that strap 110 is located on one side of the buried bit line trough. This is a result of the cutting of the gate conductor 120 and strap 110 in the trough. Additionally, note the dashed line indicating the cut plane through the gate conductor 120. Accordingly, only one side of the trough contains an active MOSFET, which is strap 110 and gate conductor 120.

A wordline mask is used to etch openings in the dielectric layers formed on top of the semiconductor substrate. The wordlines are preferably formed orthogonal to the buried bit lines as is shown in FIG. 8. First, BSG layer 132 is etched selective to nitride and then nitride layer 134 is etched selective to oxide. Thus, regions over the bit lines remain protected by oxide 130 which caps gate conductor 120, while other wordline areas are opened to the silicon substrate 100. The exposed silicon substrate 100 is then etched, using BSG 132 as a hard mask, to a depth which is preferably at least as deep as the bottom of the strap out-diffusion, which is subsequently formed. Several know methods may be used to prevent the strap out-diffusion from forming until desired and are not discussed here for sake of simplicity. The silicon 100 is also etched selective to oxide so that oxide 132 still protects gate conductor 120. It should be noted that the etching of silicon substrate 100 may also define the isolation regions in the support region. Consequently, the wordline mask may serve a dual purpose.

Figure 10:
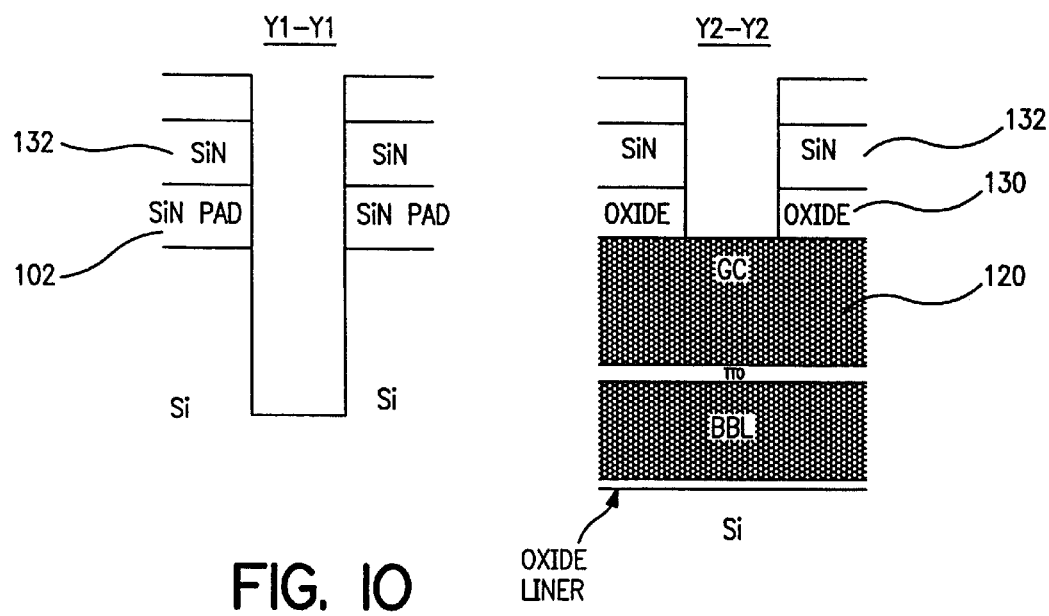
FIG. 10 is a view of FIG. 9 where the gate conductor is exposed.
Figure 11:
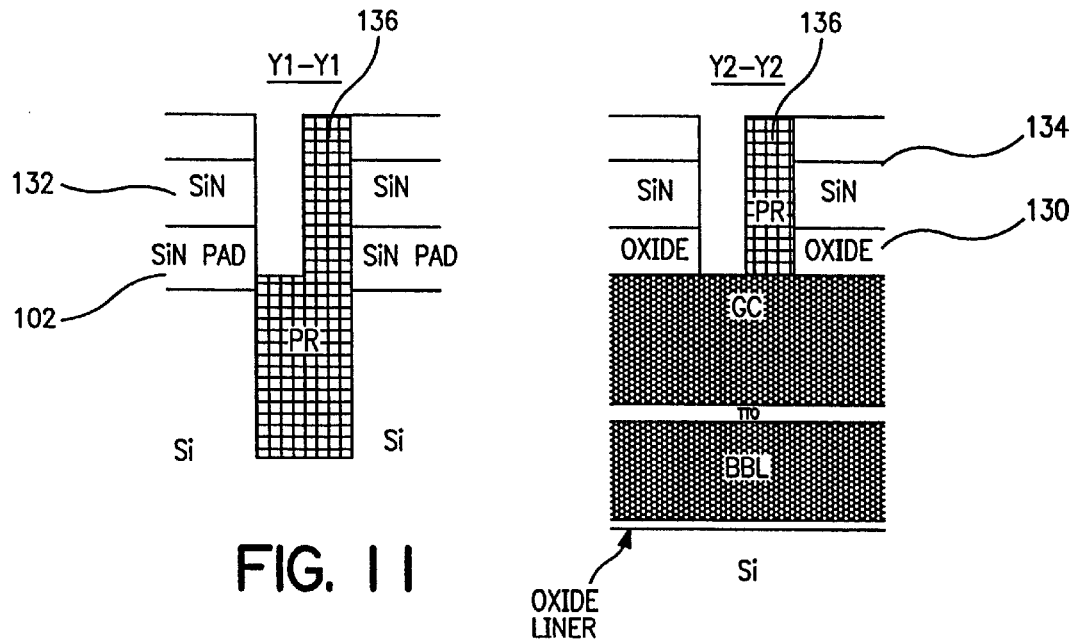
FIG. 11 is a view of FIG. 10 with a photoresist pattern formed.

Next, as shown in FIG. 10, oxide 130 is removed to expose the gate conductor 120 is removed. During these etching processes, BSG 132 will likely also be removed. A damascene resist process, similar to that described above regarding FIGS. 4–7 for cutting the gate conductor and strap, is also used here to separate the gate conductors from adjacent wordlines. This forms wordlines which are connected to a single gate conductor over every crossing bit line. Initially, a layer of photoresist 136 is deposited and polished to the top surface of nitride layer 134. Then, using a second gate conductor cut mask, photoresist 136 is exposed and developed to produce the resist pattern shown in FIG. 11. Note that the depth of exposure is preferably limited to slightly above the top surface of the silicon substrate 100 as shown in FIG. 11A. The thickness of nitride layer 134 in combination with oxide 130 will determine the thickness of photoresist 136. Consequently, the thicknesses of these layers are selected to tune the depth of exposure of the photoresist to the desired location.

Figure 12:
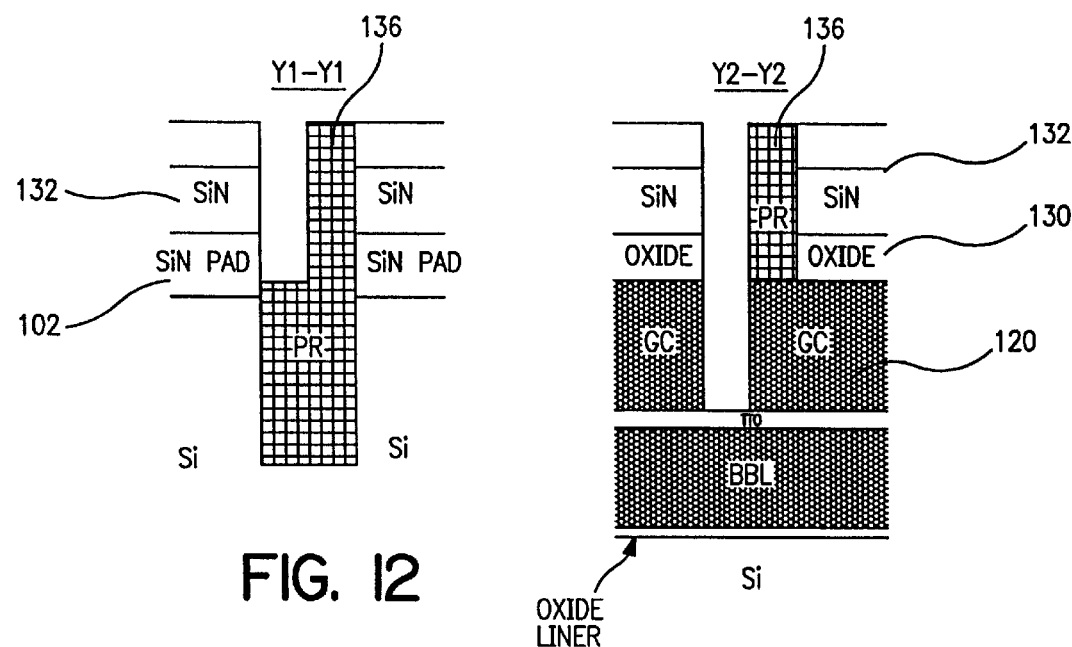
FIG. 12 is a view of FIG. 11 where the gate conductor is cut a second time.

The gate conductor 120 not covered by photoresist 136 is then etched selective to oxide, stopping on the top surface of trench top oxide 116 as shown in FIG. 12. This cut allows individual cells to be accessed.

Figure 13:
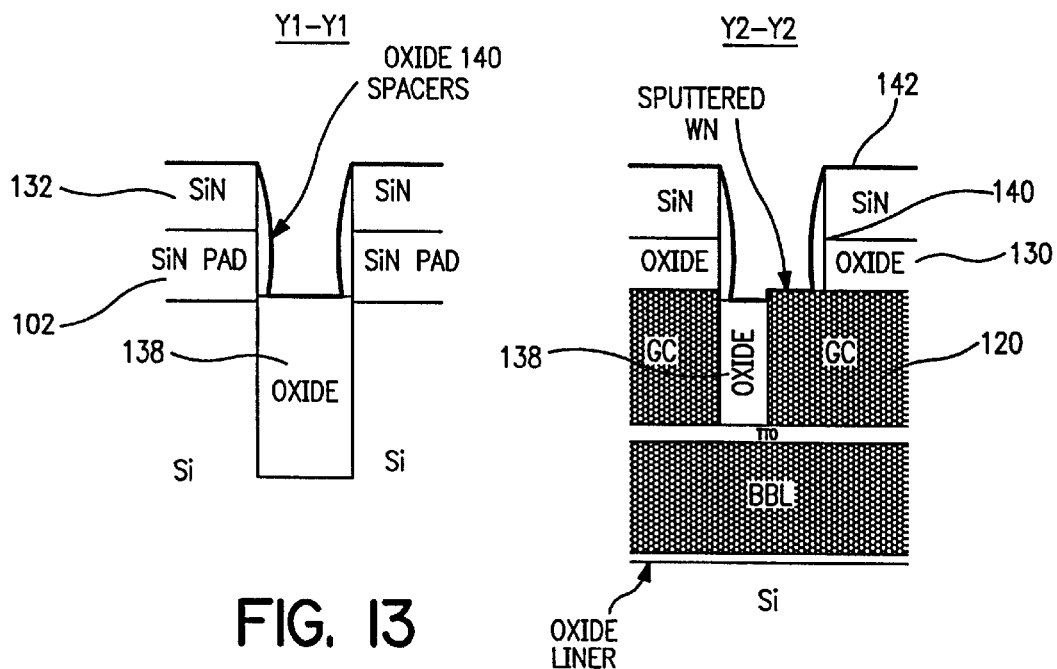
FIG. 13 shows the device of FIG. 12 with an insulator and spacers formed.

Photoresist 136 is then stripped and the openings in substrate 100 and those formed in gate conductor 120 are filled with an insulator, preferably CVD oxide 138. Oxide 138 is polished to the top surface of nitride 134 and then recessed to a depth which is preferably at least as deep as the top surface of gate conductor 120, and preferably slightly deeper, to expose the top surface of gate conductor 120 as shown in FIG. 13. CVD oxide is also formed in the support regions as an STI fill and the isolation trenches formed by the wordline mask. A block mask is used to protect the STI in the support regions during the recessing of the gate conductor 120. The top of the STI fill is made coplanar with the top surface of nitride layer 134 in the support regions. This removes all traces of wordline conductor material from the support regions during subsequent formation of the wordlines in the array region. Next, using known deposition and etching processes, spacers 140 are formed on vertical sidewall surfaces. A diffusion barrier, for example a thin layer of tungsten nitride (WN) 142, is then deposited onto the exposed surfaces. The tungsten nitride serves as a diffusion and oxidation barrier to prevent any dopants from gate conductor 120 from diffusing into the subsequently formed wordline.

Figure 14:
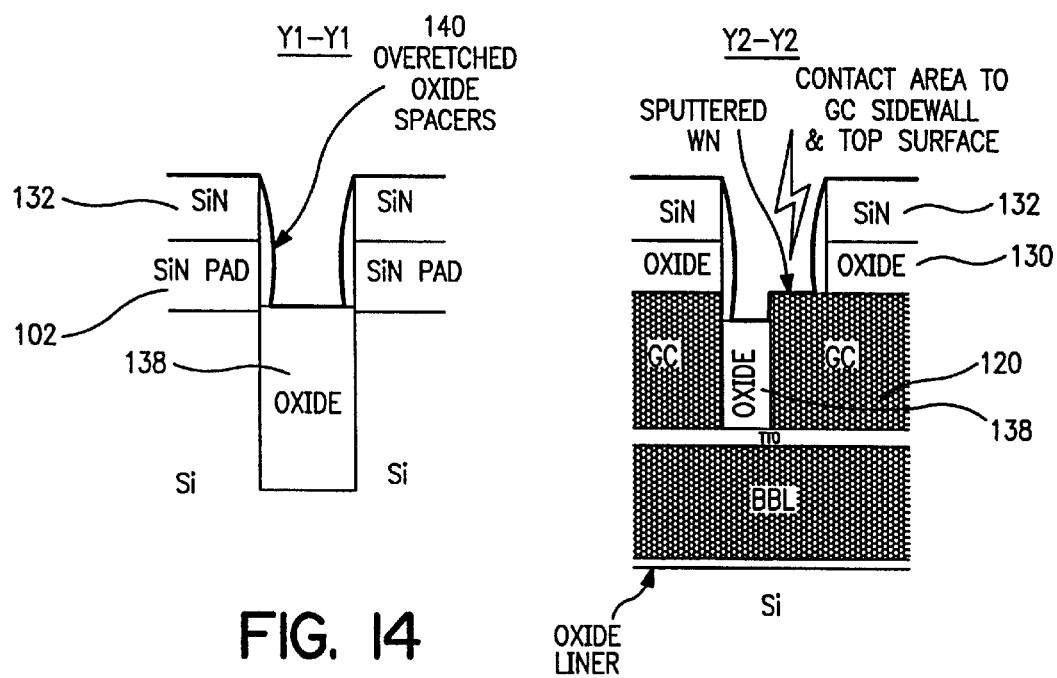
FIG. 14 shows an alternative embodiment of FIG. 13.

In an alternate embodiment shown in FIG. 14, oxide spacers 140 may be over etched. This removes some of oxide 138 to expose a portion of the sidewall of the gate conductor 120 and create a larger contact area between the gate conductor and the wordline.

Figure 15:
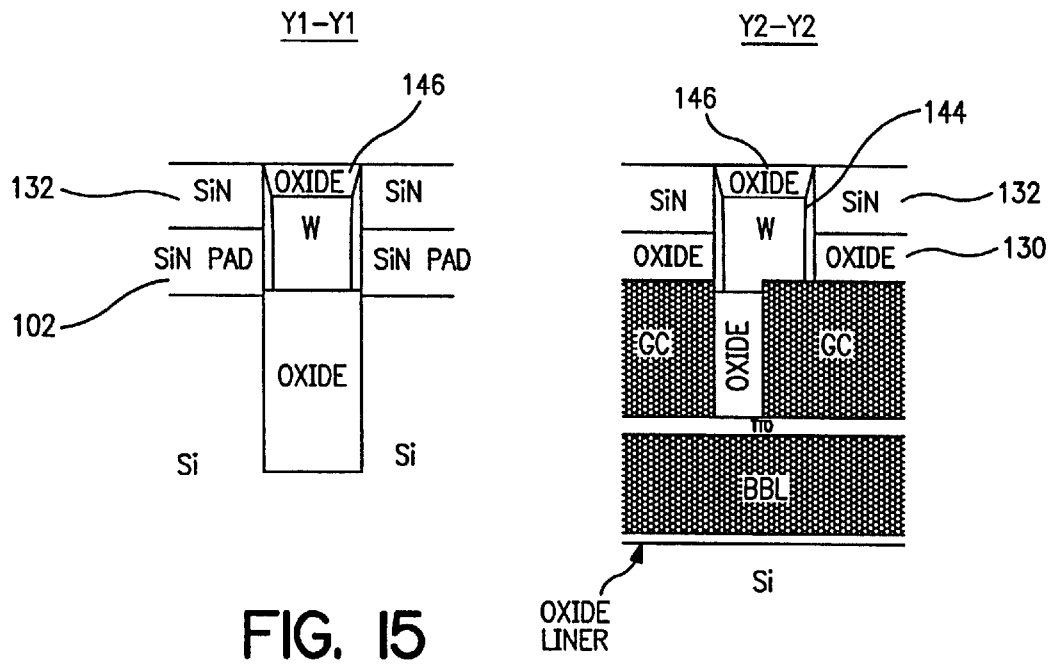
FIGS. 15–16 show the formation of wordlines.

A layer of tungsten 144 or other suitable highly conductive material is then deposited over the device and planarized to the top surface of nitride layer 134. During the planarization process, diffusion barrier 142 is removed from over the nitride layer 134. The tungsten 144 is then recessed below the top surface of nitride layer 134 and an insulating material, such as CVD oxide layer 146, is deposited and planarized, resulting in the structure shown in FIG. 15. Thus, wordline conductors 144 are capped by oxide 146 in the array region, while all wordline conductive material is removed from the support regions by the planarization process. Each wordline conductor 144 contacts a single gate conductor 120 where it crosses a bit line trough. Additionally, wordline 144 is totally encapsulated by insulating material except where it contacts gate conductor 120. In the case of the alternate embodiment shown in FIG. 14, contact between wordline 144 and gate conductor 120 includes a portion of the sidewall of gate conductor 120. This alternate embodiment ensures that contact between wordline 144 and gate conductor 120 is made, even if misalignment of the second cut mask with the wordline trough results in no horizontal contact ledge on the gate conductor 120.

Figure 16:
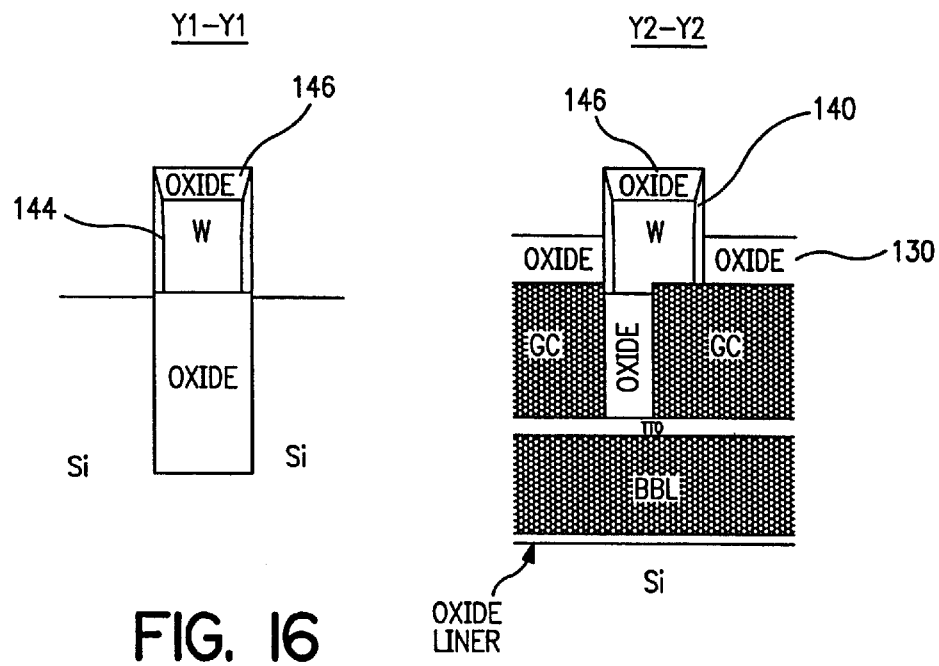
Figure 17:
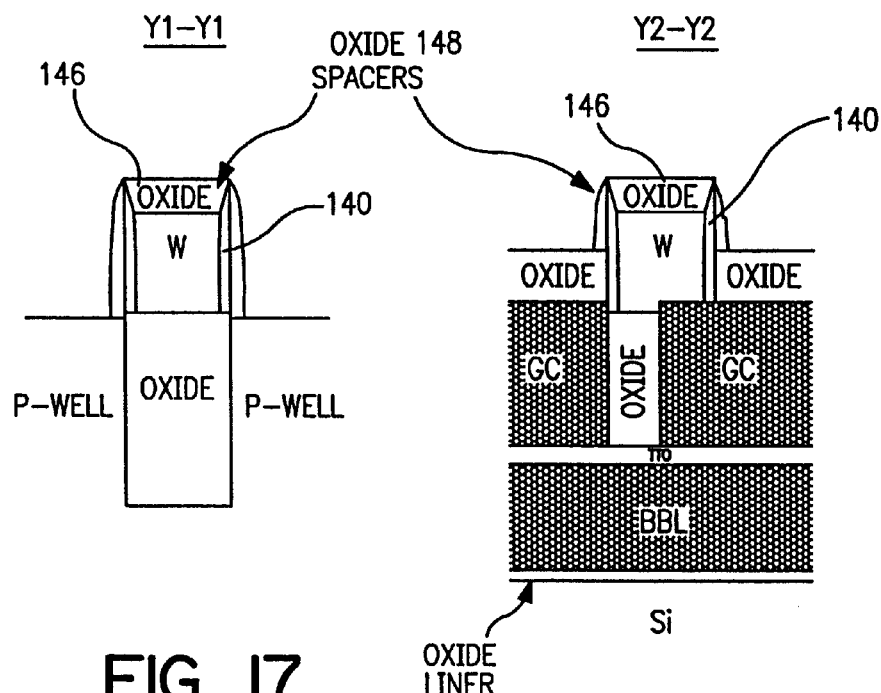
FIGS. 17–18 show the formation of wells and diffusions.
Figure 18:
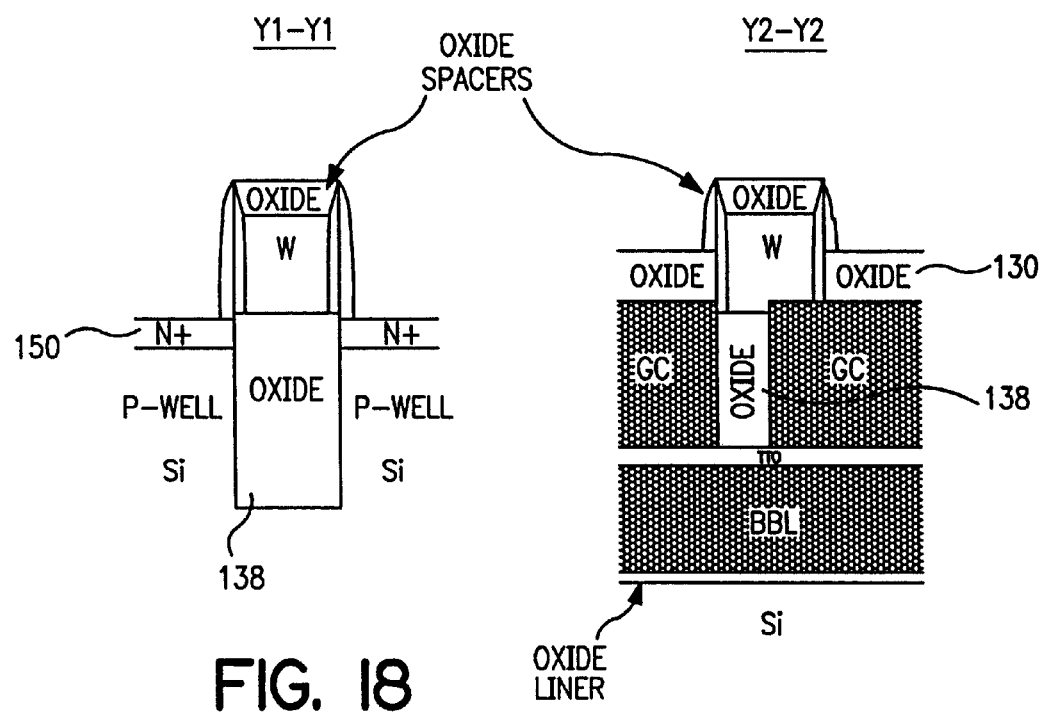

Next, nitride layer 132 and nitride pad 102 are removed blanket to the whole substrate selective to oxide, preferably using a hot phosphoric acid etch. The underlying thin pad oxide layer 101 is then removed by a short isotropic oxide etch which may also remove a negligible amount of oxide cap 146 and oxide 130 resulting in the structure shown in FIG. 16. Next, a sacrificial oxide is grown on the exposed silicon substrate surfaces and both the array and in the support regions. N- and p-wells in both the array and support regions are implanted in a known manner. Then, as shown in FIG. 17, spacers 148 are formed on the vertical sidewalls of the wordline conductors 144. The sacrificial oxide is removed by an etching process used during the formation of the spacers 148.

Gate oxide or nitrided oxide is then formed for the gate dielectric of the support MOSFETs. Using methods which are well known to one skilled in the art, the support gate conductor stack is deposited and patterned to form gate conductors. The support gate conductor mask is used to remove all support gate conductor material from the array areas. Gate conductor sidewall oxidation may also be done at this point. Then, source/drain regions for the supports and the capacitor contact diffusions 150 are implanted. If desired, additional spacers may also be formed. Note that the contact regions for the storage capacitors are formed by the maskless removal of the pre-existing nitride layers 102–132 and requires no separate mask.

Figure 19:
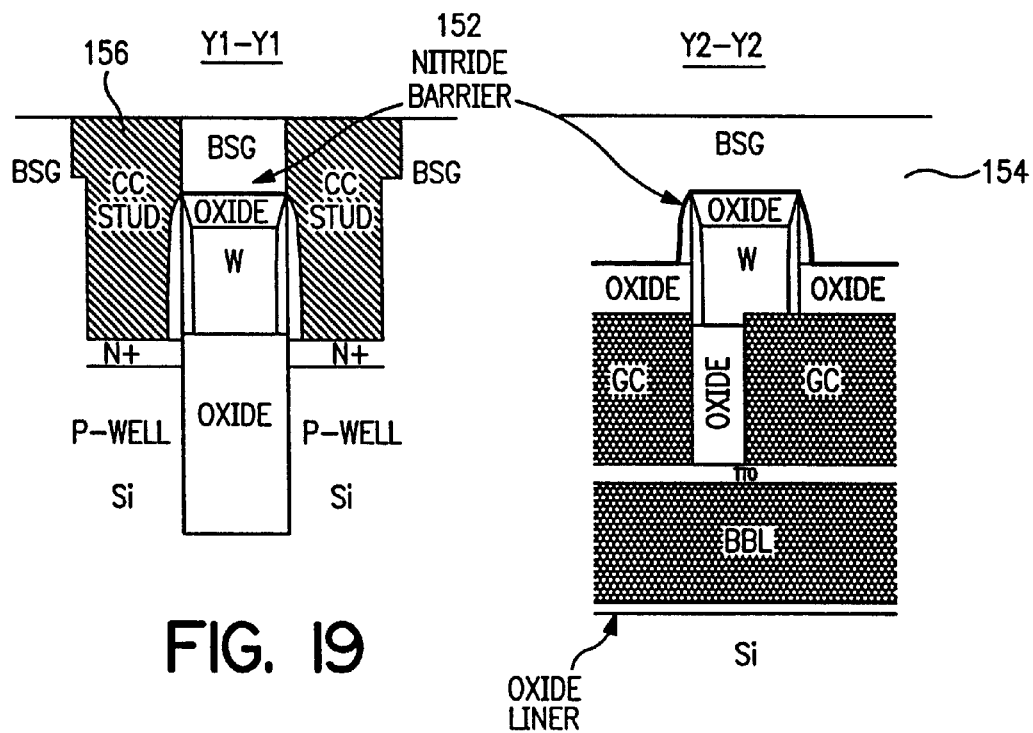
FIG. 19 shows the e formation of capacitor contacts.
Figure 20:
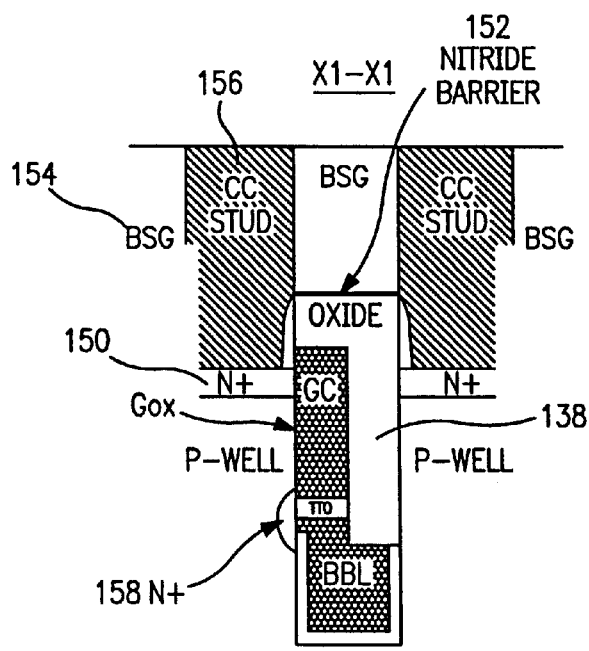
FIG. 20 is a cross-section taken among line X1–X1 at the same point in the process as FIG. 19.
Figure 21:
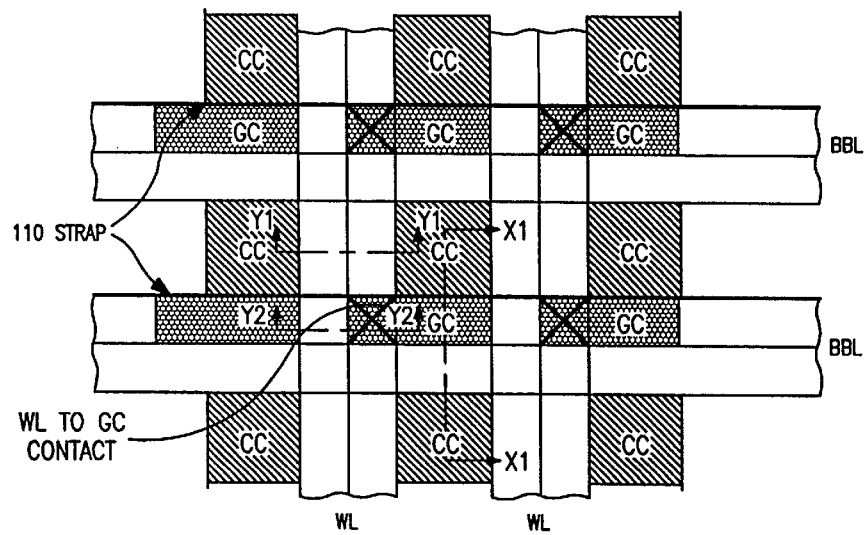
FIG. 21 is a top view at the same point in the process as FIG. 19.

As shown in FIG. 19, an etch stop layer 152, preferably nitride about 5–20 nanometers thick is deposited. An interlevel dielectric material 154, preferably BPSG, is then deposited and planarized if necessary. Contact vias are etched through the dielectric material 154 stopping on the nitride etch top layer 152. A short nitride etch which preferably has some selectivity to oxide is used to remove the exposed portion of the etch stop layer 152. Contact stud material 156, typically polysilicon or tungsten, is then deposited and planarized to the top surface of dielectric material 154. This forms contacts to the capacitor contact diffusion 150 which are borderless to the adjacent wordlines 144 and array gate conductors 120. Thus, even with this alignment between the contact via and the open silicon region in the array, shorts between the capacitor contact studs 156 and the wordline 144 or between the capacitor contact studs 156 and the array gate conductors 120 do not occur. FIG. 20 shows a cross section at lines X1—X1 at the same point in the process as shown in FIG. 19. A vertical transistor including strap out-diffusion 158, gate conductor 120 and diffusion 150 is formed. FIG. 21 shows a top view of the array region illustrating the buried bit lines, straps, wordlines, cut gate conductors, contact areas between wordlines and gate conductors, and capacitor contacts in the active silicon.

Figure 22:
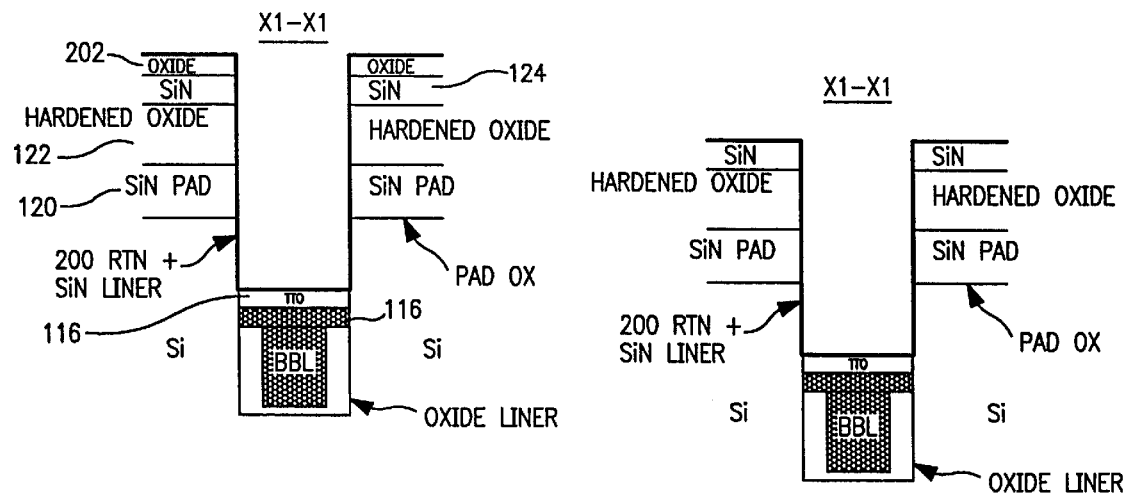
FIG. 22 is a cross section showing a buried bit line according to an embodiment of the invention.
Figure 23:
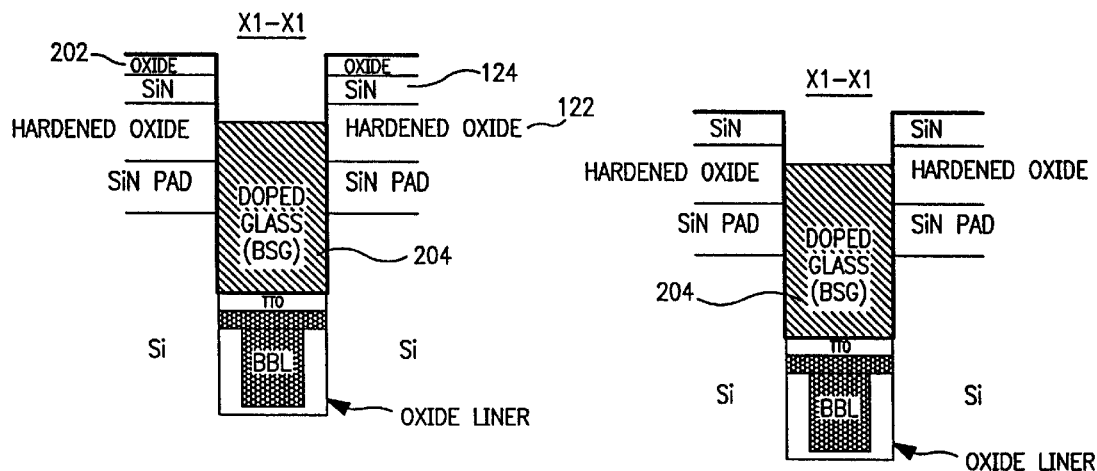
FIG. 23 shows the device of FIG. 23 with a place-holder formed above the bit line.
Figure 24:
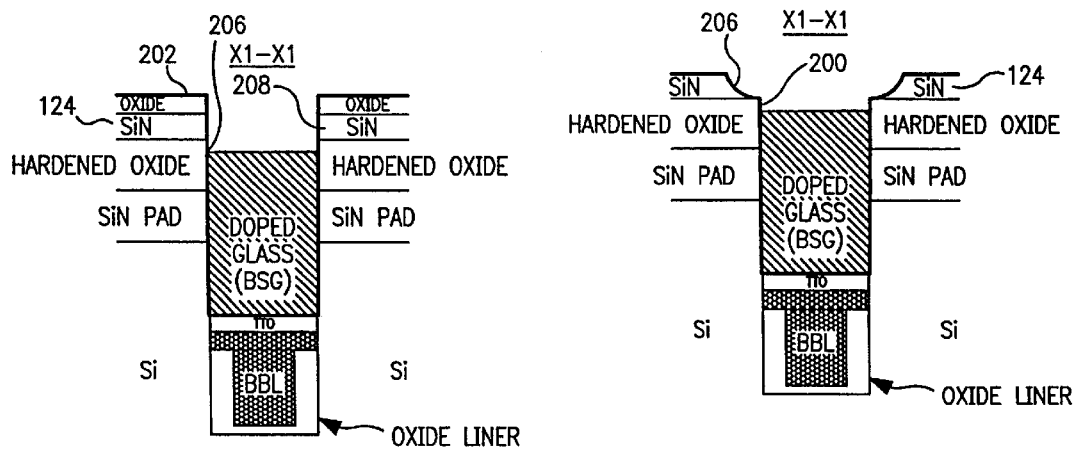
FIG. 24 shows recesses formed in a pad layer.

FIGS. 22–40 illustrate alternative embodiments of cutting the strap early in the process on one side only, thereby enabling controlled dopant out-diffusion from one side of the strap 110, yet preventing any dopant out-diffusion from the other side of the strap 110. FIG. 22 illustrates the conductor filled buried bit line trough, with the strap 110 touching the semi-conductor substrate 100 on both sides of the trough. Note that a gate oxide has not been grown on or formed along the vertical surface of the semiconductor substrate 100 below the nitride pad 120. Instead, a rapid thermal nitration (RTN) process is performed followed by deposition of a liner 200, preferably silicon nitride about 5 nanometers thick. Additionally, an optional oxide layer 202 may be provided as shown in FIG. 22A. The trough region above the trench top oxide 116 is filed with doped glass 204, preferably BSG, and recessed such that the top of the glass layer 204 is at or, preferably slightly below the interface between layer 124 and hardened oxide 122. This may be accomplished using a selective etched processing using, for example, vapor HF. BSG:oxide selectivity of less than 200:1 is routinely achieved using such a technique and results in the structure shown in FIG. 23A and FIG. 23B.

Next, in the alternate embodiment shown in FIG. 24A, silicon nitride layer 124 is pulled back using oxide layer 202 as a mask. This results in a recess 208 being formed. In the alternative embodiment shown in FIG. 24B, silicon nitride layer 124 is isotropically etched. This results in recesses 206 formed at the edges of the bit line trough. Note that the silicon nitride 124 in the embodiment shown in FIG. 24B may have its thickness reduced as a result of not having a layer on top protecting it. Oxide layer 202 is then stripped using a non-selective oxide etch. In this step, BSG 204 may be recessed slightly further. However, since the thickness of oxide 202 is preferably very small, any recessing of glass 204 is minimized. A layer 210 preferably of intrinsic polysilicon is deposited conformally over the wafer surface. The layer 210 is preferably formed about 20 nanometers thick.

Figure 25:
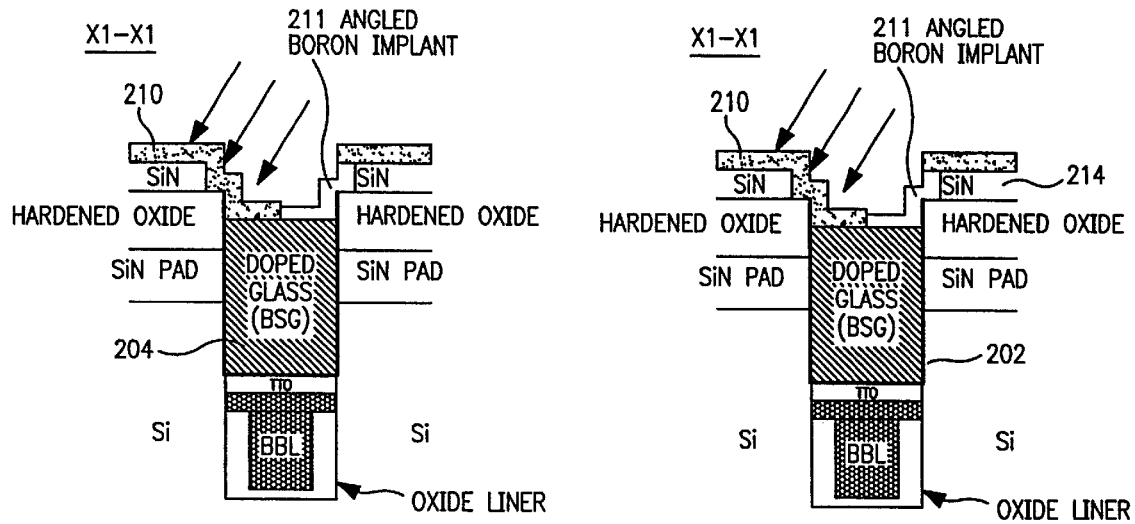
FIG. 25 shows a doped polysilicon formed over the wafer.

Following formation of layer 210 an angled implantation is performed as shown in FIG. 25. The implantation is preferably performed with boron at such an angle such that layer 210 has a portion 211 over about one-half the width of glass 204 which is not implanted with boron. The preferred aspect ratio of the structure for implantation is 1:1.

Figure 26:
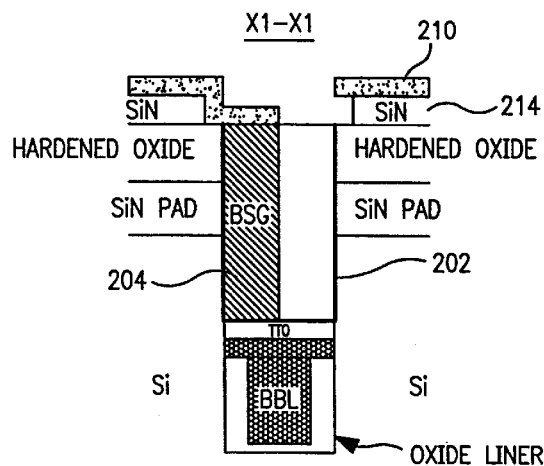
FIG. 26 shows the removal of a portion of the place holder.

From this point onwards, the two alternate embodiments are essentially equivalent and will no longer be shown separately. The unimplanted silicon layer 211 is removed, preferably by wet-etching selective to the implanted polysilicon 210. This exposes about one-half the width of glass 204. The glass layer 204 is then etched open using polysilicon 210 as a mask. Note that no lithography step is used. The process is inherently mask-less and self aligned. Consequently, one-half of glass layer 204 is removed down to trench top layer 116, creating an open volume 205 in the trough as shown in FIG. 26.

Figure 27:
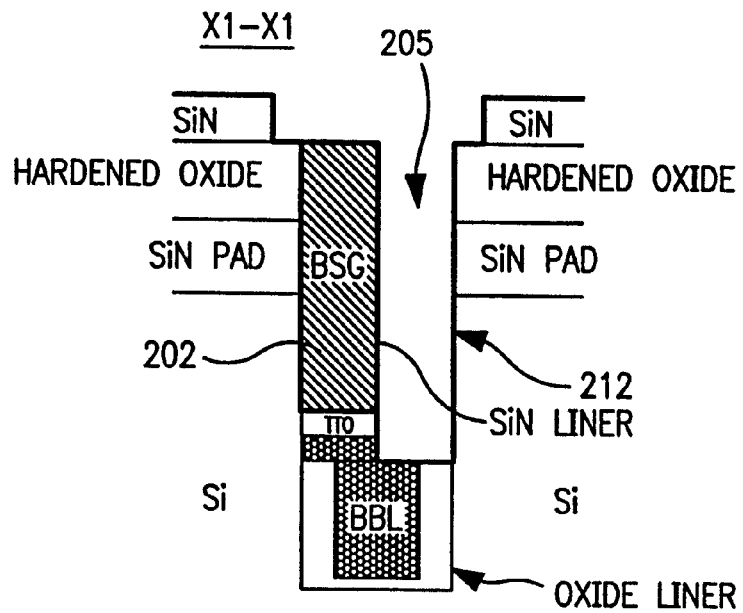
FIGS. 27–28 shows the formation of an insulator in the bit line trough.
Figure 28:
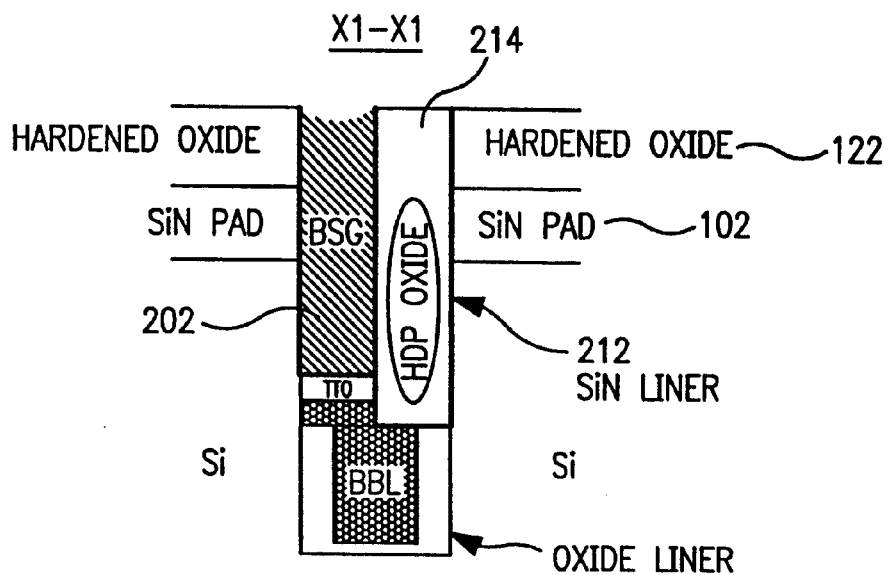

The exposed trench top layer 116 is cut, preferably wet-etched, followed by cutting, for example, wet-etching, of one side of the strap 110 as shown in FIG. 27. Polysilicon layer 210 may optionally be removed at this point. A thin nitride liner 212, preferably about six nanometers thick, is then deposited over the wafer. The open volume 205 of the trough in FIG. 27 is then filled with an insulator such as HDP oxide 214. At this point, two processing options are available, in option one a non-selective CMP is used to polish off HDP oxide 214 and nitride layer 212 up to the top of the hardened oxide 122, resulting in the structure shown in FIG. 28. In option two, after filling the open volume 205 with HDP oxide 214, CMP is preferably used to polish nitride layer 212, followed by a deglaze step and a stripping of nitride layer 212 selective to oxide. Some of the exposed glass 204 may be etched during these processes, but this will have no deleterious effect on the fabrication process.

Figure 29:
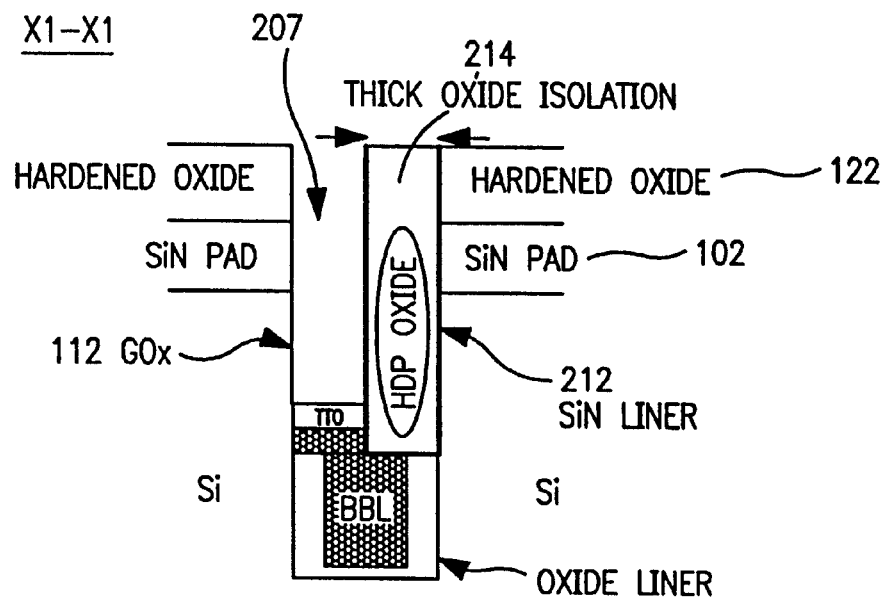
FIG. 29 shows the removal of the place-holder.
Figure 30:
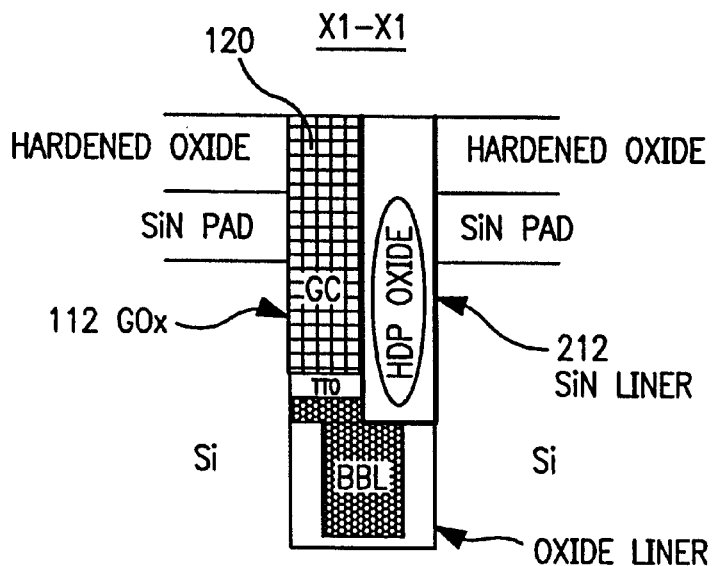
FIGS. 30–31 show formation of the gate conductor where the place-holder was.
Figure 31:
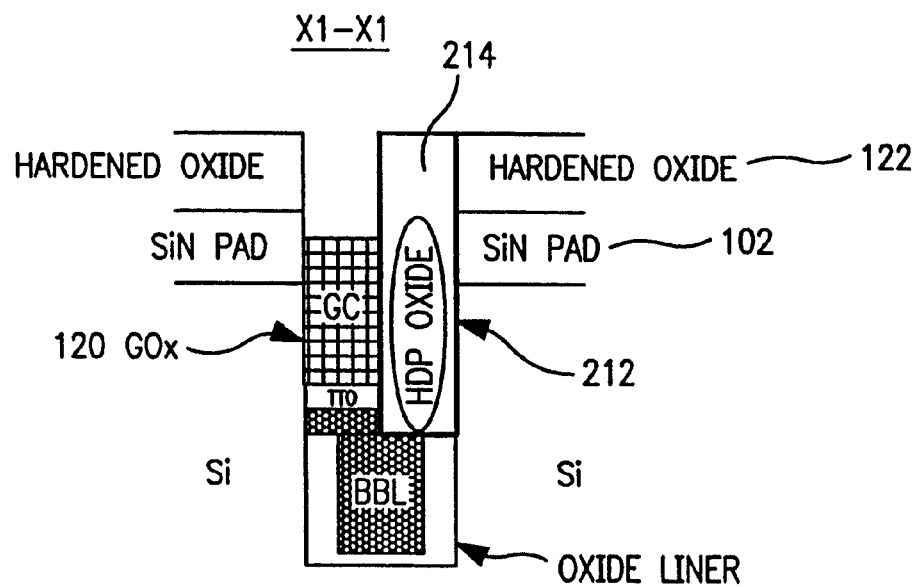
Figure 32:
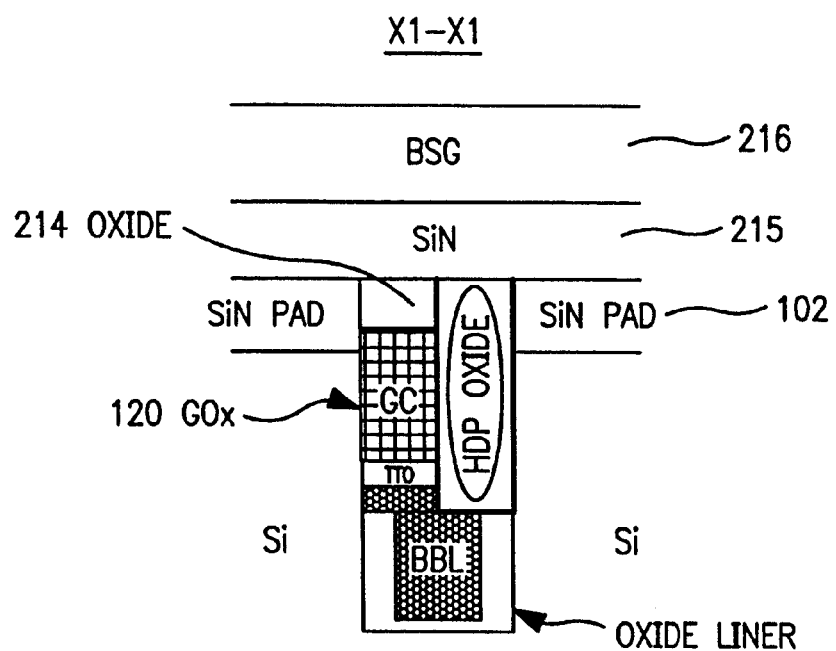
FIG. 32 shows the formation of blanket layers over the wafer.

Next as shown in FIG. 29, glass layer 204 is selectively etched out of the trough, preferably using a vapor HF tool. Note that nitride liner 212 protects the vertical surfaces of the HDP oxide 214 from being attacked during the etching process, assuring a thick oxide isolation. Gate oxide 112 is then grown on the vertical surface of the exposed semiconductor substrate 100. Since the strap 110 has previously been cut out on the opposite side of the trough, dopant out-diffusion only occurs on one side of the buried bit line. The possibility of dopant out-diffusion on the other side of the trough where the strap previously existed is completely eliminated. An open volume 207 of the trough, where glass 204 previously was, is then filled with gate conductor 120. The wafer is then polished to the top of the hardened oxide 123 preferably using CMP, resulting in the structure shown in FIG. 30. Recessing of the gate conductor 120 within the trough as shown in FIG. 31 follows this. The gate conductor is recessed to about one-half the height of the nitride pad 102. An alternative embodiment, the gate conductor 120 is filed within the trough followed by an etch back and recessing using a dry etching technique, for example, RIE or CDE, to recess the gate conductor 120 within the trough. The open trough region above gate conductor 120 is preferably filled with HDP oxide 214 followed by oxide planarization or polished using CMP to the top surface of nitride pad 102. This process also removes hardened oxide 122. A blanket layer of silicon nitride 215 is deposited followed by a blanket glass layer 216 to complete the structure shown in FIG. 32.

Figure 33:
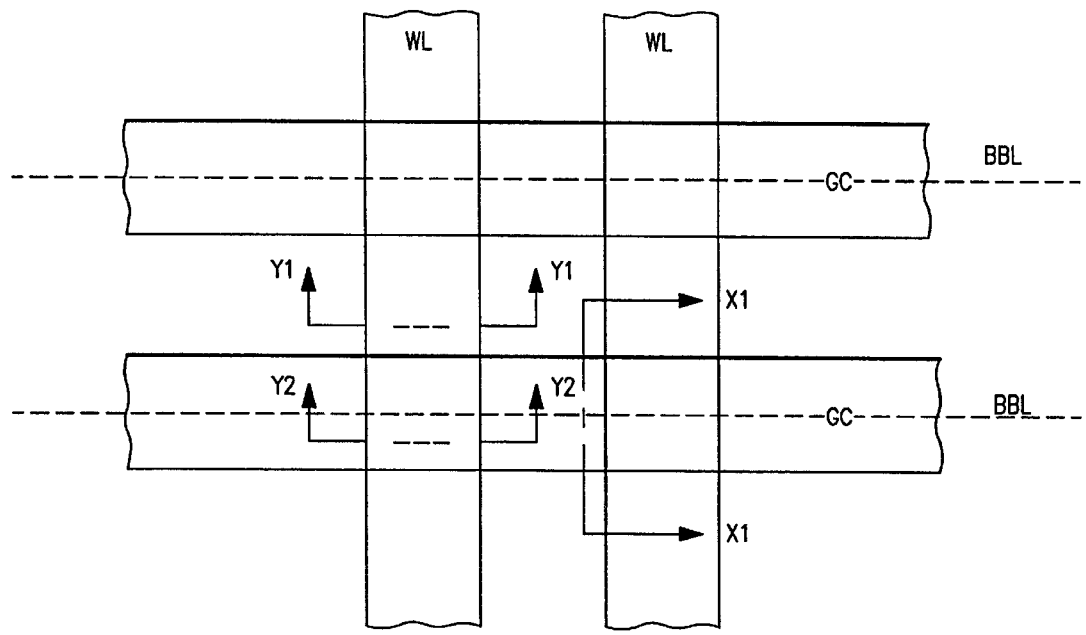
FIG. 33 is a top view showing placement of the word lines.

Next, the wordlines are formed. FIG. 33 shows a top view illustrating the placement of the wordlines. As shown on the figure, the wordlines are formed substantially orthogonal to the bit lines. Note in FIG. 22 the location of the strap 110 on one side of the buried bit line trough. The dash line in the figure denotes the location of the cut plane through the gate conductor. Thus, only the top wall, as shown in the figure, contains the active MOSFET.

Figure 34:
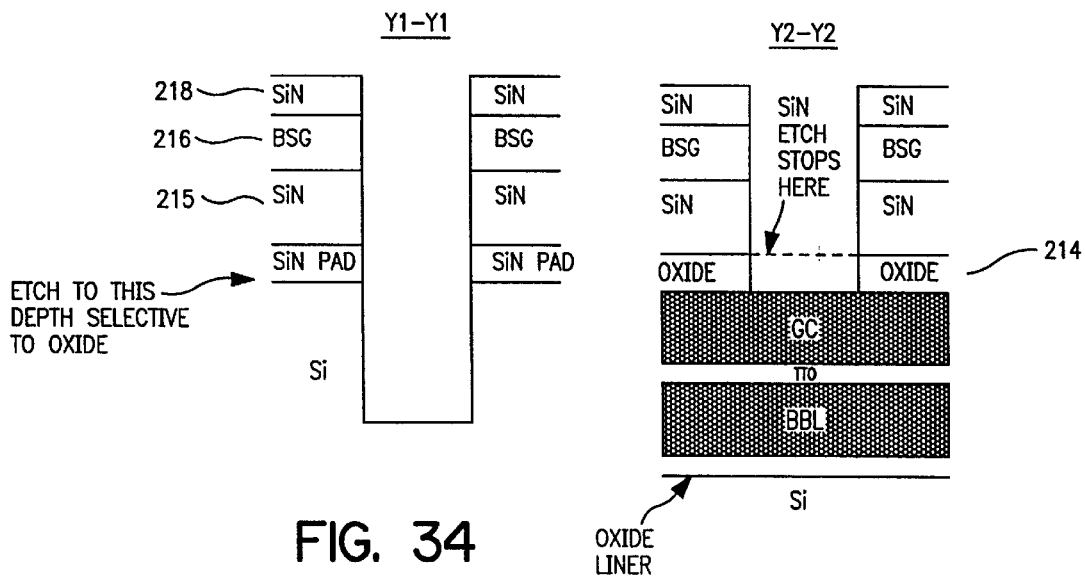
FIG. 34 is a cross-section taken along lines Y1–Y1 and Y2—Y2 of FIG. 33.
Figure 35:
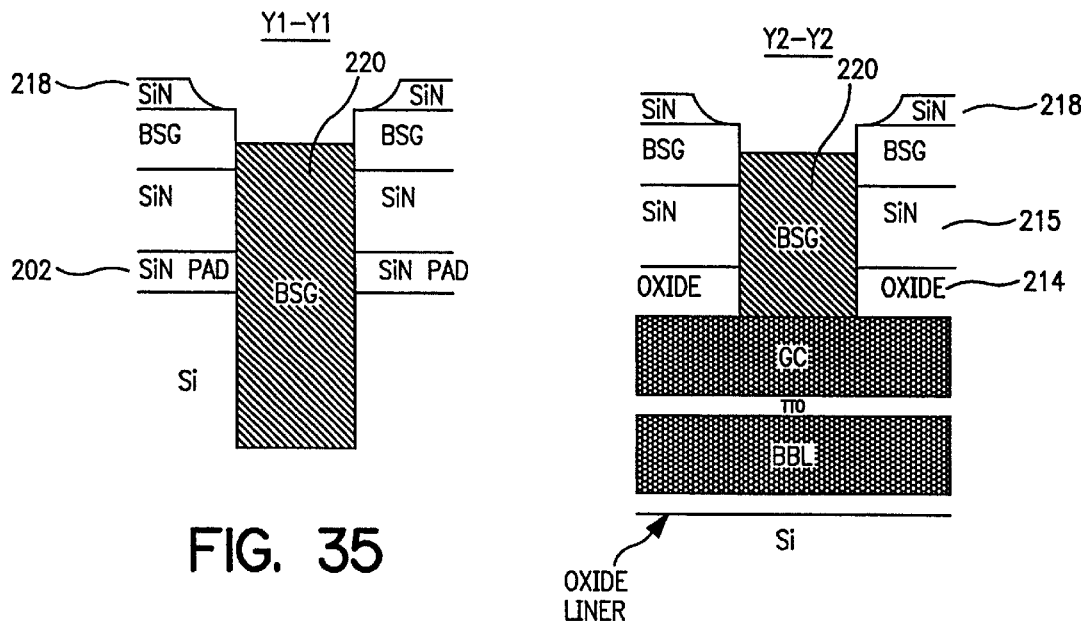
FIGS. 35–37 show process steps for forming a mask for etching the gate conductor.

Nitride layer 218 and an oxide layer formed thereon (not shown) are formed over glass layer 216. A wordline mask is used to define openings orthogonal to the buried bit line in the dielectric layers 102, 215, 216 and 218. This is followed by etching the semi-conductor substrate 100 using the oxide as a mask to a depth preferably as deep as the bottom of the strap out-diffusion, to be formed subsequently. This etching also defines the isolation regions in the support region of the device. The oxide 214 over the gate conductor 120 is then removed to expose the gate conductor 120 as shown in FIG. 34. The trough is then filled with doped glass, preferably BSG 220 and recessed such that the top of the BSG layer 220 is at or slightly beneath silicon nitride layer 218. This may be done using a selective etch process using for example, vapor HF. The top silicon nitride layer 218 is pulled back using the thin oxide layer on top (not shown) as a mask. The glass 220 protects the silicon nitride pad region 102. Hence, the top silicon nitride layer 218 can be pulled back selectively. This is very similar to the process described above regarding FIG. 24A and 24B.

Figure 36:
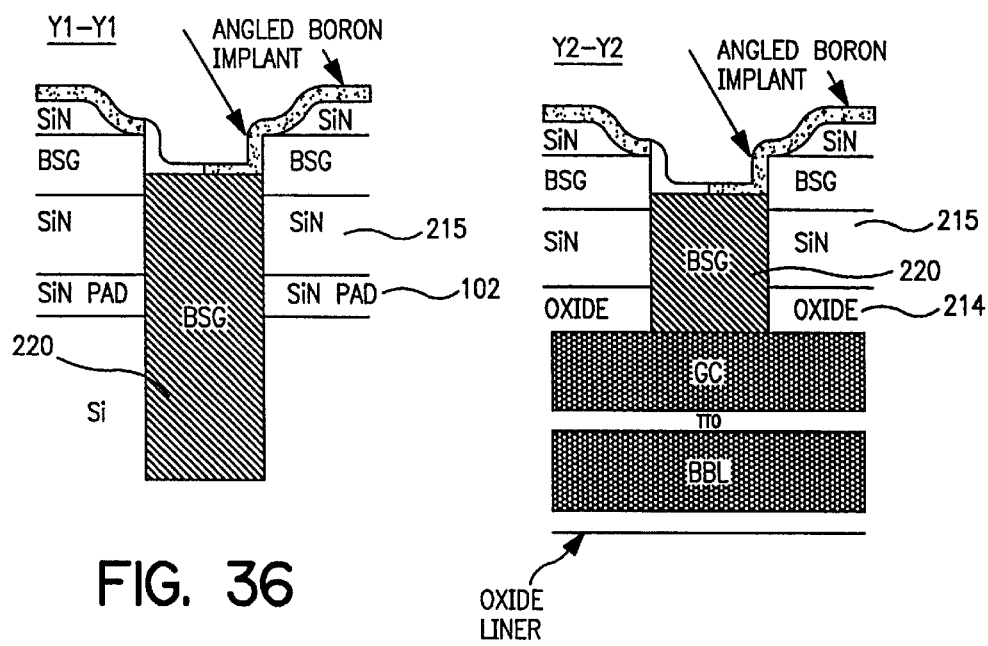

A layer 221 preferably of intrinsic polysilicon is deposited conformally over the wafer surface. The layer 221 is preferably formed about 20 nanometers thick. Following formation of layer 221 an angled implantation is performed as shown in FIG. 36. The implantation is preferably performed with boron at such an angle such that layer 221 has a portion 222 over about one-half the width of glass 220 which is not implanted with boron. The preferred aspect ratio of the structure for implantation is 1:1.

The unimplanted silicon layer 222 is removed, preferably by wet-etching selective to the implanted polysilicon 221. This exposes about one-half the width of glass 222. The glass layer 220 is then etched open using polysilicon 221 as a mask. Note that no lithography step is used. The process is inherently mask-less and self aligned. Consequently, one-half of glass layer 220 is removed down to the gate conductor 120. This exposes the gate conductor 120.

Figure 37:
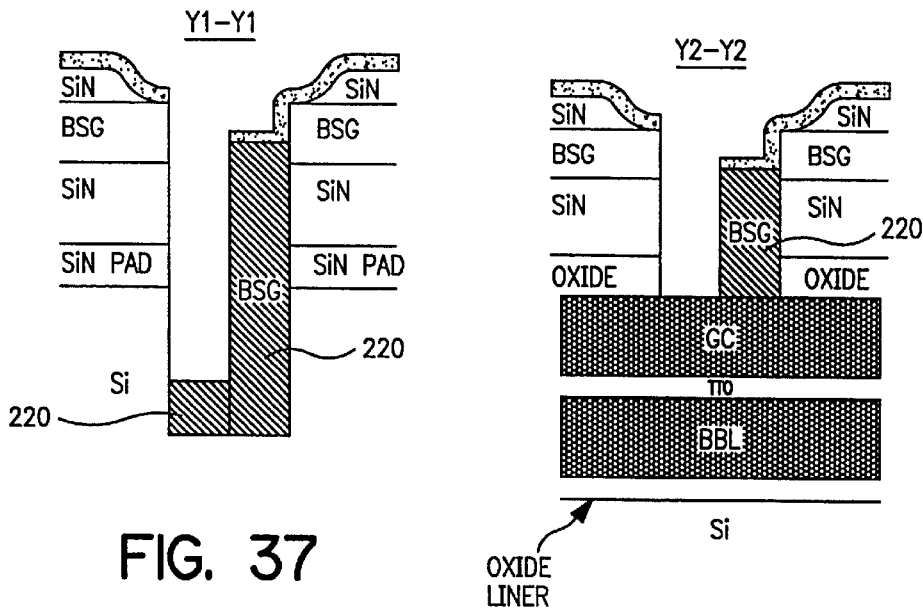
Figure 38:
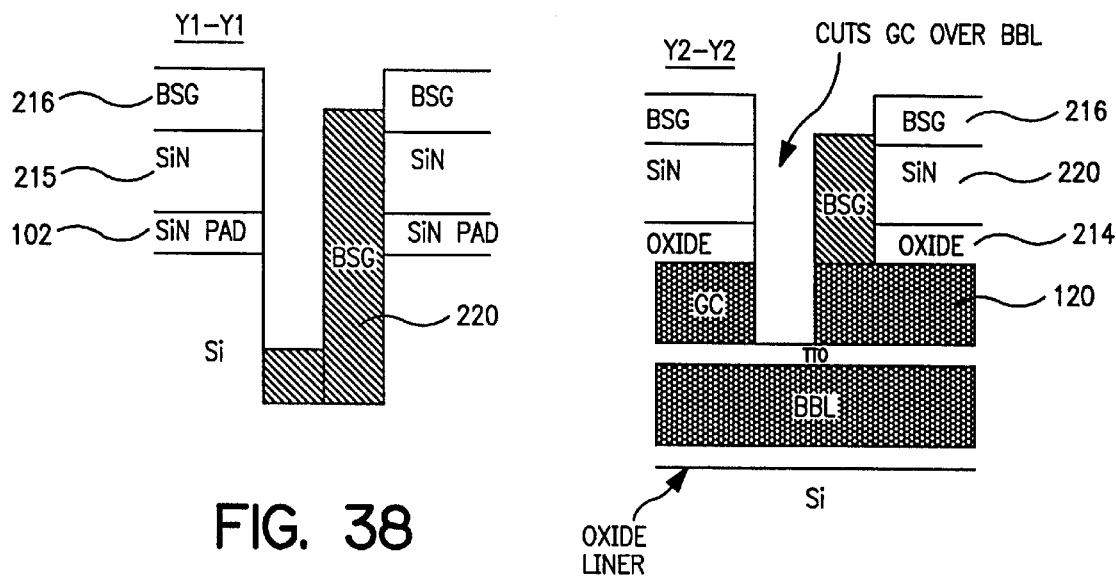
FIGS. 38–39 show the etching of the gate conductor.

Further, note that some BSG 220 is intentionally left in the exposed region of the trough bottom as shown in FIG. 37. Turning now to FIG. 38, the exposed gate conductor 120 is then etched selectively to oxide stopping on the top surface of the trench top oxide 116. The BSG 220 left behind in the trough prevents the semi-conductor substrate bottom from being etched during this process. The top polysilicon layer is removed during this etch. Additionally, some or all of the nitride layer 218 may be etched during this process.

Figure 39:
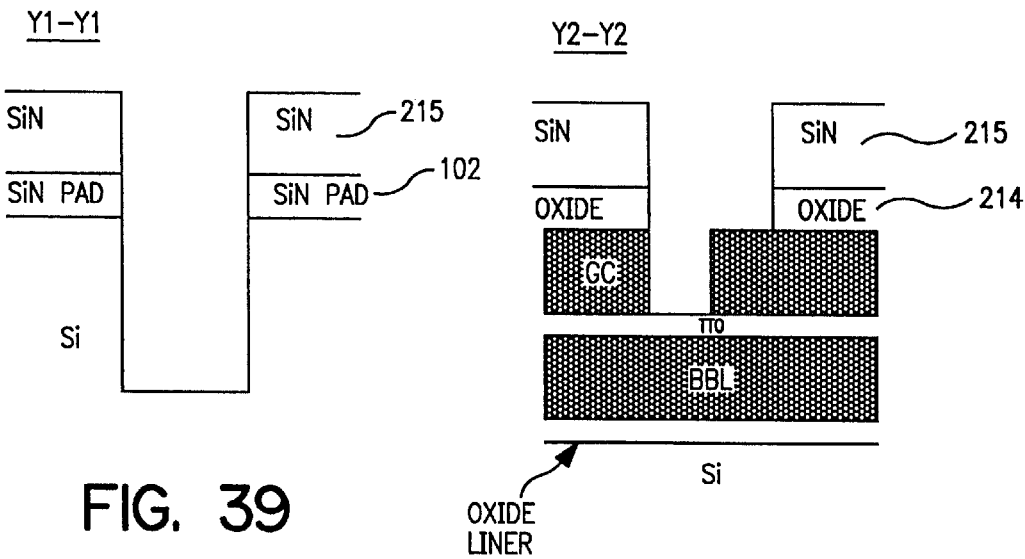
Figure 40:
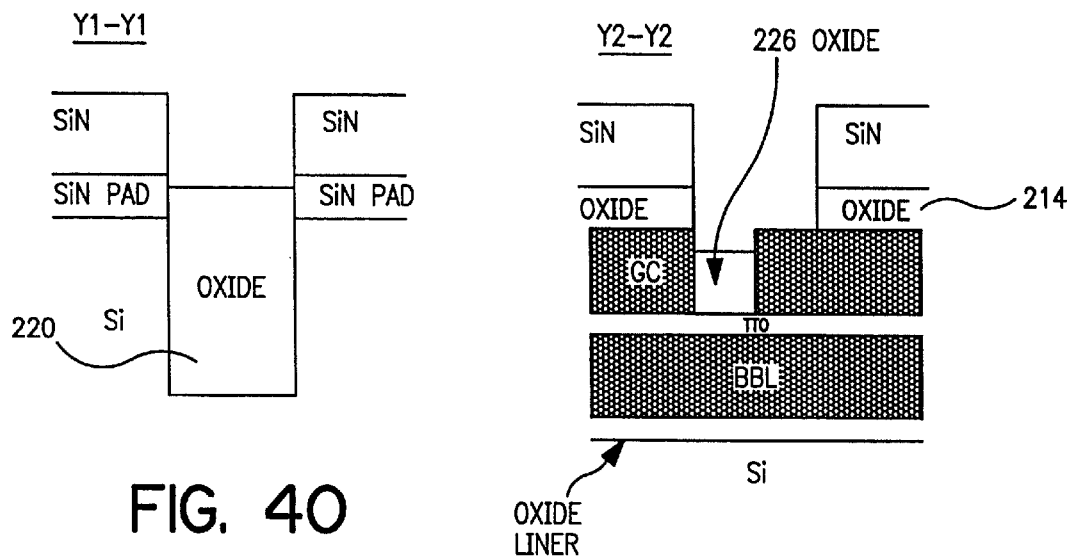
FIG. 40 shows the formation of an insulator around the gate conductor.

All of the BSG 220 remaining in the trough is then removed, preferably using a vapor HF tool with high selectivity to silicon nitride and oxide resulting in the structure shown in FIG. 39. The openings are filled with an insulator, preferably CVD oxide 226 which is polished to the top surface of nitride 215. CVD oxide 226 is then recessed to a depth, which is preferably at least at as deep as the top surface of the gate conductor 120, and ideally slightly deeper. In the support regions, a block mask is used to protect the CVD oxide used as STI fill in the isolation trenches formed by the wordline mask from the recess operation. By making the top surface of the STI fill coplanar with nitride 215 in the supports, all traces of wordline conductive material is removed from the supports during subsequent formation of wordlines in the array. Formation of the wordlines may now be carried out as described above, beginning with FIG. 13.

The structures and methods describe herein are not restricted to the layout of the embodiments described above. It is further taught that by maintaining a 2F wordline pitch, the space between wordline conductors may be reduced to sub-1F, while the wordline width may be increased above 1F. Such a layout facilitates the application of the second gate conductor cut mask to separating adjacent gate conductors. Greater than 1F width with less than 1F space may be obtained by using a variety of well-known techniques, which include over exposure of the wordline pattern, over-etch of wordline troughs, and phase shift masking methods. Although a similar approach may be applied to the bit line trough pattern, it must also be assured that the strap out-diffusion is sufficiently shallow to maintain an undepleted region between the strap metallurgical junction and the edge of the active area opposite the neighboring gate conductor. With the 1F distance between gated active area surface and back edge, body pinch-off should not a problem for even minimum feature size F significantly smaller than 100 nm.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A method of forming a vertical transistor, comprising:
   a) forming a pad layer over a semiconductor substrate;
   b) forming a trough through the pad layer and in the semiconductor substrate;
   c) forming a bit line buried in the trough, the bit line being enclosed by a dielectric material;
   d) forming a strap extending through the dielectric material to connect the bit line to the semiconductor substrate;
   e) filling the trough above the bit line with a conductor;
   f) cutting the conductor along its longitudinal axis such that the conductor remains on one side of the trough;
   g) forming wordline troughs, substantially orthogonal to the bit line, above the semiconductor substrate;
   h) removing a portion of the conductor under the wordline trough to separate the conductor into separate gate conductors; and
   i) forming wordlines in the wordline trough connected to the separate gate conductors.

2. The method of claim 1 wherein step f) comprises:
   patterning a layer of photoresist on the semiconductor substrate, the photo resist covering a portion of the conductor; and
   etching the conductor using the photoresist as a mask.

3. The method of claim 2 wherein an edge of the photoresist is about mid-way across the trough.

4. The method of claim 1 wherein step f) comprises:
   providing a hard mask on the pad layer;
   recessing the conductor;
   depositing a layer of photoresist;
   performing a CMP to planarize the photoresist to a top surface of the hard mask;
   developing a resist pattern such that the photoresist cover a portion of the conductor; and
   etching the conductor using the photoresist as a mask.

5. The method of claim 4 wherein the conductor is recessed slightly above a top surface of the semiconductor substrate.

6. The method of claim 4 wherein and edge of the photoresist is about mid-way across a width of the trough.

7. The method of claim 4 further comprising forming an insulator in an opening formed by etching the conductor.

8. The method of claim 1 wherein the wordline troughs are formed in a dielectric layer.

9. The method of claim 8, wherein step h):
   forming a hard mask on the dielectric layer;
   exposing the conductor under the wordline troughs;
   depositing a layer of photoresist;
   performing a CMP to planarize the photoresist to a top surface of the hard mask;
   developing a resist pattern such that the photoresist cover a portion of the conductor; and
   etching the conductor using the photoresist as a mask.

10. The method of claim 9 wherein the conductor is cut orthogonal to its longitudinal axis.

11. The method of claim 9 further comprising forming an insulator in openings formed by the etching.

* * * * *